(12) United States Patent
Shino (10) Patent No.: US 11,940,503 B2
(45) Date of Patent: Mar. 26, 2024

(54) MAGNETIC SENSOR CIRCUIT AND MAGNETIC FIELD DETECTION DEVICE

(71) Applicant: SHOWA DENKO K.K., Tokyo (JP)

(72) Inventor: Tatsunori Shino, Ichihara (JP)

(73) Assignee: Resonac Corporation, Tokyo (JP)

( * ) Notice: Subject to any disclaimer, the term of this patent is extended or adjusted under 35 U.S.C. 154(b) by 113 days.

(21) Appl. No.: 17/375,367

(22) Filed: Jul. 14, 2021

(65) Prior Publication Data
US 2022/0043076 A1 Feb. 10, 2022

(30) Foreign Application Priority Data

Aug. 6, 2020 (JP) .................. 2020-134148

(51) Int. Cl.
*G01R 33/06* (2006.01)

(52) U.S. Cl.
CPC .................. *G01R 33/063* (2013.01)

(58) Field of Classification Search
CPC ...... G01R 33/06; G01R 33/02; G01R 33/063; G01R 33/00; G01R 33/0011; G01R 33/0023; G01R 33/091; G01R 33/093; G01R 33/095
See application file for complete search history.

(56) References Cited

U.S. PATENT DOCUMENTS

| | | | |
|---|---|---|---|
| 6,069,475 A * | 5/2000 | Isomura ............... | G01R 33/02 360/110 |
| 6,104,593 A | 8/2000 | Kawase et al. | |
| 6,404,182 B1 | 6/2002 | Kawase et al. | |
| 2013/0181701 A1* | 7/2013 | Galbraith .............. | G01N 27/90 324/232 |

FOREIGN PATENT DOCUMENTS

| | | |
|---|---|---|
| EP | 0 833 162 B1 | 11/2003 |
| JP | 2002-243815 A | 8/2002 |
| JP | 2003-177167 A | 6/2003 |
| JP | 2007-085824 A | 4/2007 |

OTHER PUBLICATIONS

Extended European Search Report dated Dec. 17, 2021 in European Application No. 21184707.4.

* cited by examiner

*Primary Examiner* — Son T Le
(74) *Attorney, Agent, or Firm* — Sughrue Mion, PLLC (57) ABSTRACT

A magnetic sensor circuit includes: a first element including series-connected resistor and capacitor, or including only a capacitor; a second element including series-connected resistor and inductor, or including a magnetic sensor sensing a magnetic field by a magnetic impedance effect; a third element including series-connected resistor and capacitor, or including only a capacitor; and a fourth element including a magnetic sensor sensing a magnetic field by a magnetic impedance effect, wherein a first series circuit part including the series-connected first and second elements and a second series circuit part including the series-connected third and fourth elements are connected in parallel, and, when the magnetic field sensed by the magnetic sensor has a predetermined reference value, a product of impedance Z1 of the first element and impedance Z4 of the fourth element and a product of impedance Z2 of the second element and impedance Z3 of the third element are equal.

4 Claims, 8 Drawing Sheets

MAGNETIC SENSOR CIRCUIT AND MAGNETIC FIELD DETECTION DEVICE

CROSS REFERENCE TO RELATED APPLICATIONS

This application is based on and claims priority under 35 USC § 119 to Japanese Patent Application No. 2020-134148 filed Aug. 6, 2020, the disclosure is incorporated herein by reference in its entirety.

BACKGROUND

Technical Field

The present invention relates to a magnetic sensor circuit and a magnetic field detection device.

Related Art

As a conventional art, Japanese Patent Application Laid-Open Publication No. 2003-177167 discloses a technique in a magnetic sensor for detecting an external magnetic field by the magnetic impedance effect, the technique detecting a differential voltage vector between a back electromotive force vector generated on the terminal of a magnetic sensor element and a required reference voltage vector, and measuring the external magnetic field and/or the polarity. The technique connects the magnetic sensor to a bridge circuit, to thereby increase the detection accuracy.

By the way, even in a case where a magnetic sensor, which is sensitive to magnetic fields due to the magnetic impedance effect, was connected to a bridge circuit, the accuracy of detection of the magnetic fields was sometimes insufficient depending on a configuration of the bridge circuit.

An object of the present invention is, in a magnetic sensor circuit including a magnetic sensor sensing a magnetic field by a magnetic impedance effect and in a magnetic field detection device using the magnetic sensor circuit, to improve the accuracy of detection of a magnetic field.

SUMMARY

A magnetic sensor circuit to which the present invention is applied includes: a first element including a resistor and a capacitor that are connected in series, or including only a capacitor; a second element including a resistor and an inductor that are connected in series, or including a magnetic sensor sensing a magnetic field by a magnetic impedance effect; a third element including a resistor and a capacitor that are connected in series, or including only a capacitor; and a fourth element including a magnetic sensor sensing a magnetic field by a magnetic impedance effect, wherein a first series circuit part including the first element and the second element that are connected in series and a second series circuit part including the third element and the fourth element that are connected in series are connected in parallel, and, in a case where the magnetic field sensed by the magnetic sensor has a predetermined reference value, a product of impedance Z1 of the first element and impedance Z4 of the fourth element and a product of impedance Z2 of the second element and impedance Z3 of the third element are equal.

Moreover, in such a magnetic sensor circuit, in the case where the magnetic field sensed by the magnetic sensor has the predetermined reference value, the impedance Z1 of the first element and the impedance Z3 of the third element are equal, and the impedance Z2 of the second element and the impedance Z4 of the fourth element are equal.

Moreover, in such a magnetic sensor circuit, resistance of the resistor in the first element and resistance of the resistor in the third element are equal, and capacitance of the capacitor in the first element and capacitance of the capacitor in the third element are equal.

Moreover, in such a magnetic sensor circuit, a ratio $(X_C/X_L)$ of capacitive reactance $X_C$ of the capacitor of the first element to inductive reactance $X_L$ of the inductor of the second element or the magnetic sensor of the second element is not less than 1.

Moreover, from another standpoint, a magnetic field detection device to which the present invention is applied includes: a bridge circuit part including a first element including a resistor and a capacitor that are connected in series or including only a capacitor, a second element including a resistor and an inductor that are connected in series or including a magnetic sensor sensing a magnetic field by a magnetic impedance effect, a third element including a resistor and a capacitor that are connected in series or including only a capacitor, and a fourth element including a magnetic sensor sensing a magnetic field by a magnetic impedance effect, the first element and the second element being connected in series to constitute a first series circuit part, the third element and the fourth element being connected in series to constitute a second series circuit part, and the first series circuit part and the second series circuit part being connected in parallel; a voltage application part supplying an input voltage having predetermined frequency and amplitude to the bridge circuit part; and a magnetic field detection part detecting a magnetic field based on a difference in voltage between a connection point of the first element and the second element in the first series circuit part and a connection point of the third element and the fourth element in the second series circuit part.

Advantageous Effects of Invention

According to the present invention, it is possible, in a magnetic sensor circuit including a magnetic sensor sensing a magnetic field by a magnetic impedance effect and in a magnetic field detection device using the magnetic sensor circuit, to improve the accuracy of detection of a magnetic field.

BRIEF DESCRIPTION OF THE DRAWINGS

An exemplary embodiment of the present invention will be described in detail based on the following figures, wherein.

DETAILED DESCRIPTION

Hereinafter, an exemplary embodiment according to the present invention will be described with reference to attached drawings.

(Magnetic Field Detection Device 1)

Figure 1:
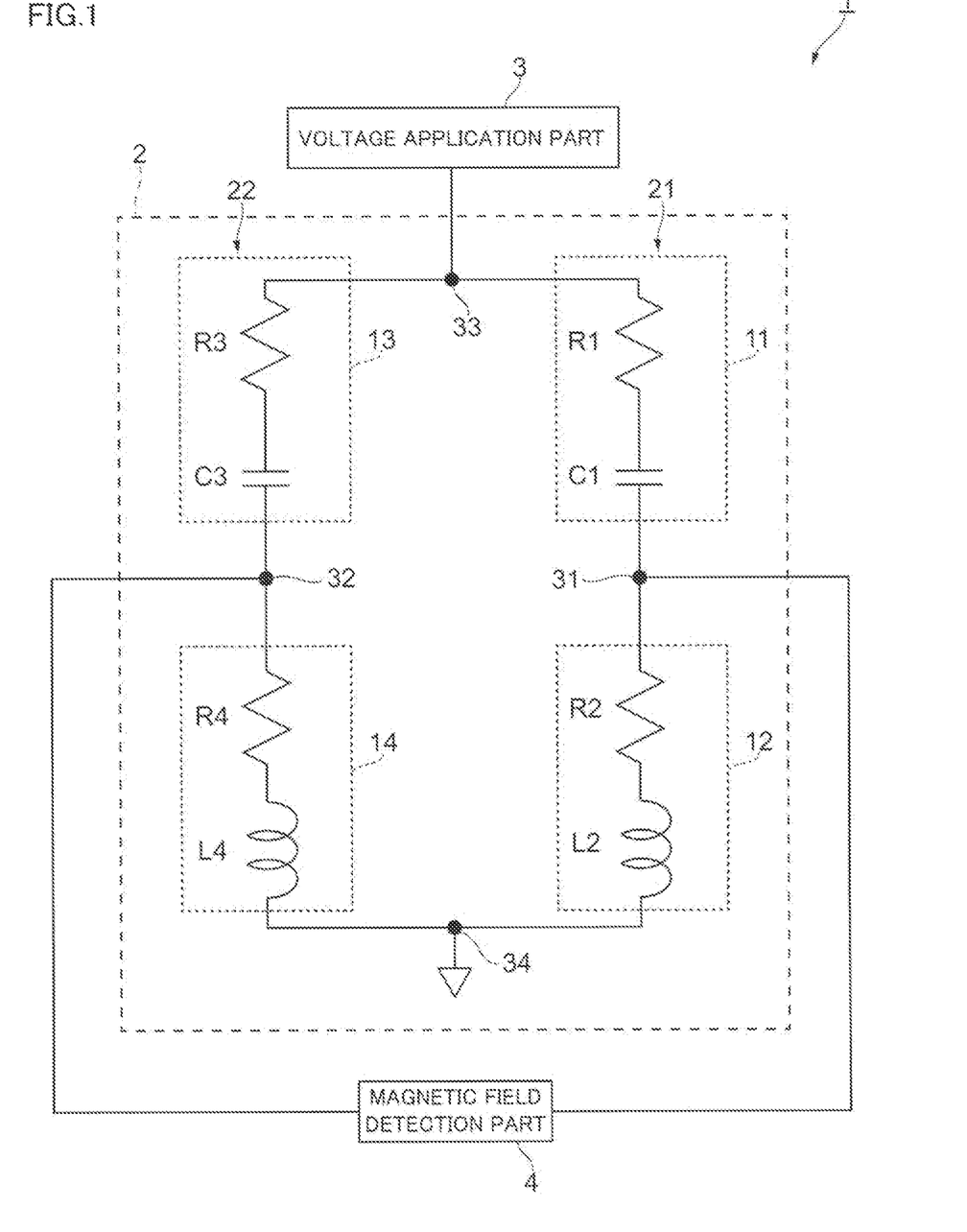
FIG. 1 illustrates a magnetic field detection device to which the exemplary embodiment is applied.

FIG. 1 illustrates a magnetic field detection device 1 to which the exemplary embodiment is applied. The magnetic field detection device 1 includes: a magnetic sensor circuit 2; a voltage application part 3 applying a predetermined period of high frequency voltage to the magnetic sensor circuit 2; and a magnetic field detection part 4 detecting magnetic fields or changes in magnetic fields sensed by a magnetic sensor 14, which is described later, in the magnetic sensor circuit 2 based on the output from the magnetic sensor circuit 2.

(Magnetic Sensor Circuit 2)

As shown in FIG. 1, the magnetic sensor circuit 2 is an example of a bridge circuit part, and includes a first element 11, a second element 12, a third element 13 and the magnetic sensor 14. In the magnetic sensor circuit 2, the first element 11, the second element 12, the third element 13 and the magnetic sensor 14 constitute a bridge circuit.

Specifically, the magnetic sensor circuit 2 includes a first series circuit part 21 configured by serially connecting the first element 11 and the second element 12 via a first connection point 31. The magnetic sensor circuit 2 also includes a second series circuit part 22 configured by serially connecting the third element 13 and the magnetic sensor 14 via a second connection point 32.

Further, in the magnetic sensor circuit 2, an end portion, which is closer to the first element 11, of the first series circuit part 21 and an end portion, which is closer to the third element 13, of the second series circuit part 22 are connected via a third connection point 33. Still further, in the magnetic sensor circuit 2, an end portion, which is closer to the second element 12, of the first series circuit part 21 and an end portion, which is closer to the magnetic sensor 14, of the second series circuit part 22 are connected via a fourth connection point 34. Consequently, in the magnetic sensor circuit 2, the first series circuit part 21 and the second series circuit part 22 are connected in parallel, and the first element 11, the second element 12, the third element 13 and the magnetic sensor 14 constitute the bridge circuit.

Moreover, in the magnetic sensor circuit 2, the voltage application part 3 is connected to the third connection point 33. Further, in the magnetic sensor circuit 2, the fourth connection point 34 is grounded. The high frequency voltage with a predetermined frequency is applied to the magnetic sensor circuit 2 by the voltage application part 3 via the third connection point 33 and the fourth connection point 34.

Further, in the magnetic sensor circuit 2, the magnetic field detection part 4 is connected to the first connection point 31 and the second connection point 32. Though details will be described later, the magnetic field detection part 4 measures the voltage of the first connection point 31 (the voltage V1 to be described later) and the voltage of the second connection point 32 (the voltage V2 to be described later). The magnetic field detection part 4 detects changes in the magnetic field sensed by the magnetic sensor 14 based on the difference between the voltage V1 of the first connection point 31 and the voltage V2 of the second connection point 32 (V2−V1, the output voltage $V_{out}$ to be described later).

As shown in FIG. 1, in the magnetic sensor circuit 2 of the exemplary embodiment, the first element 11 is configured with a resistor R1 and a capacitor C1 connected in series. The second element 12 is configured with a resistor R2 and an inductor L2 connected in series. In addition, the third element 13 is configured with a resistor R3 and a capacitor C3 connected in series.

Though details will be described later, in the exemplary embodiment, the first element 11 including the capacitor C1 and the third element 13 including the capacitor C3 make it possible to increase the amplitude of the output voltage $V_{out}$ from the magnetic sensor circuit 2, to thereby improve the accuracy of the detection of changes in the magnetic field by the magnetic field detection device 1.

Moreover, the magnetic sensor 14 can be treated as an equivalent circuit in which a resistor R4 and an inductor L4 are connected in series. The impedance Z4 of the magnetic sensor 14 changes in accordance with the magnitude of the magnetic field sensed by the magnetic sensor 14. With this, the resistance of the resistor R4 and the inductance of the inductor L4 of the magnetic sensor 14 change in accordance with the magnitude of the magnetic field sensed by the magnetic sensor 14.

Here, in the magnetic sensor circuit 2 of the exemplary embodiment, the magnetic sensor 14 constitutes the fourth element.

In the magnetic sensor circuit 2, in the case where the magnetic field sensed by the magnetic sensor 14 has a predetermined reference value (for example, in the case where the magnetic field sensed by the magnetic sensor 14 is 0H), the impedance Z1 of the first element 11 and the impedance Z3 of the third element 13 are designed to be equal (Z1=Z3). Similarly, in the magnetic sensor circuit 2, in the case where the magnetic field sensed by the magnetic sensor 14 has a predetermined reference value, the impedance Z2 of the second element 12 and the impedance Z4 of the magnetic sensor 14 (namely, the fourth element) are set to be equal (Z2=Z4).

Consequently, in the magnetic sensor circuit 2, in the case where the magnetic field sensed by the magnetic sensor 14 has a predetermined reference value, the product of the impedance Z1 of the first element 11 and the impedance Z4 of the magnetic sensor 14 and the product of the impedance Z2 of the second element 12 and the impedance Z3 of the third element 13 are equal (Z1*Z4=Z2*Z3).

Note that, in the following description, a state where the product of the impedance Z1 of the first element 11 and the impedance Z4 of the magnetic sensor 14 and the product of the impedance Z2 of the second element 12 and the impedance Z3 of the third element 13 are equal is referred to as "The magnetic sensor circuit 2 satisfies equilibrium conditions."

In the magnetic sensor circuit 2, it is preferable that the resistance of the resistor R1 of the first element 11 is equal to the resistance of the resistor R3 of the third element 13 (R1=R3). It is also preferable that the capacitance of the capacitor C1 of the first element 11 is equal to the capacitance of the capacitor C3 of the third element 13 (C1=C3). This makes it possible to adopt mutually equal structures as the first element 11 and the third element 13. As a result, the magnetic sensor circuit 2 can satisfy equilibrium conditions with a simple configuration.

Note that the capacitance of the capacitor C1 of the first element 11 and the capacitance of the capacitor C3 of the third element 13 can be set in accordance with the configurations of the second element 12, the magnetic sensor 14, and the like.

Further, in the magnetic sensor circuit 2, in the case where the magnetic field sensed by the magnetic sensor 14 has a predetermined reference value, it is preferable that the resistance of the resistor R2 of the second element 12 and the resistance of the resistor R4 of the magnetic sensor 14 are equal (R2=R4). Moreover, in the magnetic sensor circuit 2, in the case where the magnetic field sensed by the magnetic sensor 14 has a predetermined reference value, it is preferable that the inductance of the inductor L2 of the second element 12 and the inductance of the inductor L4 of the magnetic sensor 14 are equal (L2=L4).

(Voltage Application Part 3)

The voltage application part 3 is connected to the third connection point 33 of the magnetic sensor circuit 2 and applies a high-frequency voltage with predetermined amplitude and frequency to the magnetic sensor circuit 2.

The magnitude (amplitude) of the high-frequency voltage applied to the magnetic sensor circuit 2 by the voltage application part 3 can be within the range from 0.1 V to 10 V, for example. In addition, the frequency of the high-frequency voltage applied to the magnetic sensor circuit 2 by the voltage application part 3 can be within the range from 1 MHz to 100 MHz, for example. Note that each condition of the high-frequency voltage applied to the magnetic sensor circuit 2 by the voltage application part 3 can be set in accordance with the circuit configuration of the magnetic sensor circuit 2 and the size of the magnetic field that is to be measured, and is not limited to the above-described ranges.

(Magnetic Field Detection Part 4)

The magnetic field detection part 4 is connected to the first connection point 31 and the second connection point 32 of the magnetic sensor circuit 2.

The magnetic field detection part 4 measures the voltage outputted from the magnetic sensor circuit 2 when the high-frequency voltage is applied to the magnetic sensor circuit 2 by the voltage application part 3. Then, based on the measured voltage, changes in the magnetic field sensed by the magnetic sensor 14 are detected.

Specifically, the magnetic field detection part 4 measures the voltage V1 at the first connection point 31 and the voltage V2 at the second connection point 32 in the magnetic sensor circuit 2, and obtains the difference (V2−V1) between the voltage V1 and the voltage V2 as the output voltage $V_{out}$.

Thought details will be described later, in the magnetic sensor circuit 2, in the case where the magnetic field sensed by the magnetic sensor 14 has a predetermined reference value (that is, in the case where the magnetic sensor circuit 2 satisfies the equilibrium conditions), the amplitude of the output voltage $V_{out}$ outputted from the magnetic sensor circuit 2 is 0. Moreover, in the magnetic sensor circuit 2, in the case where the magnetic field sensed by the magnetic sensor 14 changes from the predetermined reference value, the amplitude of the output voltage $V_{out}$ outputted from the magnetic sensor circuit 2 also changes.

The magnetic field detection part 4 stores the relationship between the magnitude of the magnetic field sensed by the magnetic sensor 14 and the amplitude of the output voltage $V_{out}$ outputted from the magnetic sensor circuit 2. Then, based on the obtained amplitude of the output voltage $V_{out}$, changes in the magnetic field sensed by the magnetic sensor 14 are detected.

(Method of Measuring Magnetic Field by Magnetic Field Detection Device 1)

Subsequently, an example of the method of measuring the magnetic field by the magnetic field detection device 1 of the exemplary embodiment will be described, the magnetic field being sensed by the magnetic sensor 14.

In the case of measuring the magnetic field by the magnetic field detection device 1, first, the voltage application part 3 applies a high-frequency voltage with predetermined amplitude and frequency to the magnetic sensor circuit 2.

Here, in the magnetic sensor circuit 2 configured with bridge circuits, in the case where the high-frequency voltage applied by the voltage application part 3 is assumed to be $V_{in}$, the output voltage $V_{out}$, which is the difference (V2−V1) between the voltage V1 at the first connection point 31 and the voltage V2 at the second connection point 32, is expressed by the following formula (1):

$$V_{out} = \{(Z2*Z3-Z1*Z4)/(Z1+Z3)*(Z2+Z4)\}V_{in} \quad (1)$$

In the case where the external magnetic field applied to the magnetic sensor 14 has a predetermined reference value (for example, OH), the magnetic sensor circuit 2 satisfies the equilibrium conditions (Z1*Z4=Z2*Z3), and the amplitude of the output voltage $V_{out}$ is 0.

Moreover, in the case where the magnetic field sensed by the magnetic sensor 14 changes from the predetermined reference value, the impedance Z4 of the magnetic sensor 14 changes as described above. As a result, the amplitude of the output voltage $V_{out}$ changes in accordance with the impedance Z4 of the magnetic sensor 14. In other words, the amplitude of the output voltage $V_{out}$ becomes a value corresponding to the changes in the magnetic field sensed by the magnetic sensor 14.

The magnetic field detection part 4 can obtain the amount of change in the magnetic field sensed by the magnetic sensor 14 from the amplitude of the output voltage $V_{out}$ by obtaining, in advance, the correlation between the amplitude of the output voltage $V_{out}$ and the amount of change in the magnetic field sensed by the magnetic sensor 14.

Note that the correlation between the amplitude of the output voltage $V_{out}$ and the amount of change in the magnetic field sensed by the magnetic sensor 14 can be obtained, for example, by setting the magnetic sensor 14 of the magnetic sensor circuit 2 inside the magnetic field generation device and measuring the relationship between the amplitude of the output voltage $V_{out}$ and the magnitude of the magnetic field.

As described above, in the magnetic field detection device 1 of the exemplary embodiment, the changes in the external magnetic field sensed by the magnetic sensor 14 can be converted into the amplitude of the output voltage $V_{out}$ outputted from the magnetic sensor circuit 2.

Here, as described above, the magnetic sensor circuit 2 includes the capacitor C1, in which the first element 11 is connected in series to the resistor R1, and the capacitor C3, in which the third element 13 is connected in series to the resistor R3. Consequently, as compared to, for example, the case in which the first element 11 or the third element 13 does not include a capacitor that is connected in series to a resistor, or the case in which the first element 11 or the third element 13 includes a capacitor that is connected in parallel to a resistor, it is possible to increase the amplitude of the output voltage $V_{out}$ outputted from the magnetic sensor circuit 2 in the case where the magnetic field sensed by the magnetic sensor 14 changes from the reference value. As a result, in the exemplary embodiment, the accuracy of the detection of the magnetic field by the magnetic field detection device 1 can be improved.

(Amplitude of Output Voltage $V_{out}$)

Subsequently, in the magnetic field detection device 1, the output voltage $V_{out}$ that is outputted from the magnetic sensor circuit 2 and detected by the magnetic field detection part 4 in accordance with the changes in the magnetic field sensed by the magnetic sensor 14 will be described in detail as compared to conventional examples.

Figure 2:
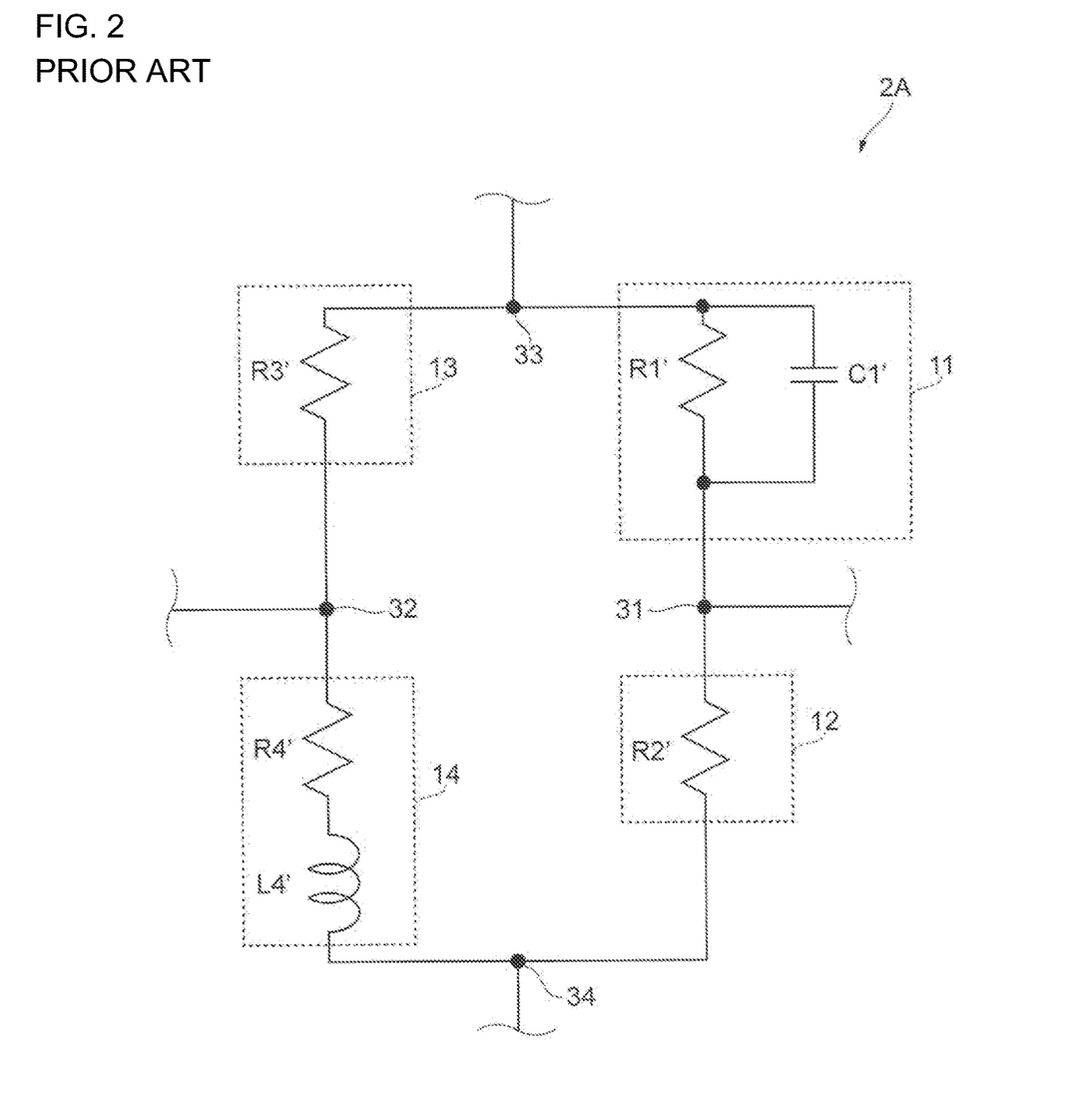
FIG. 2 shows an example of a configuration of a conventional magnetic sensor circuit.

FIG. 2 shows an example of a configuration of a conventional magnetic sensor circuit 2A. The conventional magnetic sensor circuit 2A shown in FIG. 2 has a similar configuration to the magnetic sensor circuit 2 of the exemplary embodiment shown in FIG. 1, except for the configurations of the first element 11, the second element 12 and the third element 13. In FIG. 2 and the description below, the same reference signs are used for the common configurations between the magnetic sensor circuit 2 of the exemplary embodiment shown in FIG. 1 and the conventional magnetic sensor circuit 2A.

In the conventional magnetic sensor circuit 2A shown in FIG. 2, the first element 11 is configured with a resistor R1' and a capacitor C1' that are connected in parallel. Moreover, in the conventional magnetic sensor circuit 2A, the second element 12 is configured with a resistor R2' and there is no inductor L2 (refer to FIG. 1) that is connected in series to the resistor R2'. Further, in the conventional magnetic sensor circuit 2A, the third element 13 is configured with a resistor R3' and there is no capacitor C3 (refer to FIG. 1) that is connected in series to the resistor R3'. Still further, in the conventional magnetic sensor circuit 2A, similar to the magnetic sensor circuit 2 of the exemplary embodiment shown in FIG. 1, the magnetic sensor 14 is configured with an equivalent circuit in which a resistor R4' and an inductor L4' are connected in series.

Similar to the magnetic sensor circuit 2, the conventional magnetic sensor circuit 2A shown in FIG. 2 satisfies the equilibrium conditions in the case where the magnetic field sensed by the magnetic sensor 14 has a predetermined reference value (OH). In other words, in the conventional magnetic sensor circuit 2A, in the case where the magnetic field sensed by the magnetic sensor 14 has a predetermined reference value, the product of the impedance Z1' of the first element 11 and the impedance Z4' of the magnetic sensor 14 and the product of the impedance Z2' of the second element 12 and the impedance Z3' of the third element 13 are equal ($Z1'*Z4'=Z2'*Z3'$).

Then, similar to the magnetic sensor circuit 2, in the conventional magnetic sensor circuit 2A, in the case where the magnetic field sensed by the magnetic sensor 14 changes from the predetermined reference value, the amplitude of the output voltage $V_{out}$ outputted from the magnetic sensor circuit 2A also changes. Note that, thought description of the details will be omitted, in the conventional magnetic sensor circuit 2A, in the case where the magnetic field sensed by the magnetic sensor 14 changes from the predetermined reference value, the phase of the output voltage $V_{out}$ also changes.

Figure 3:
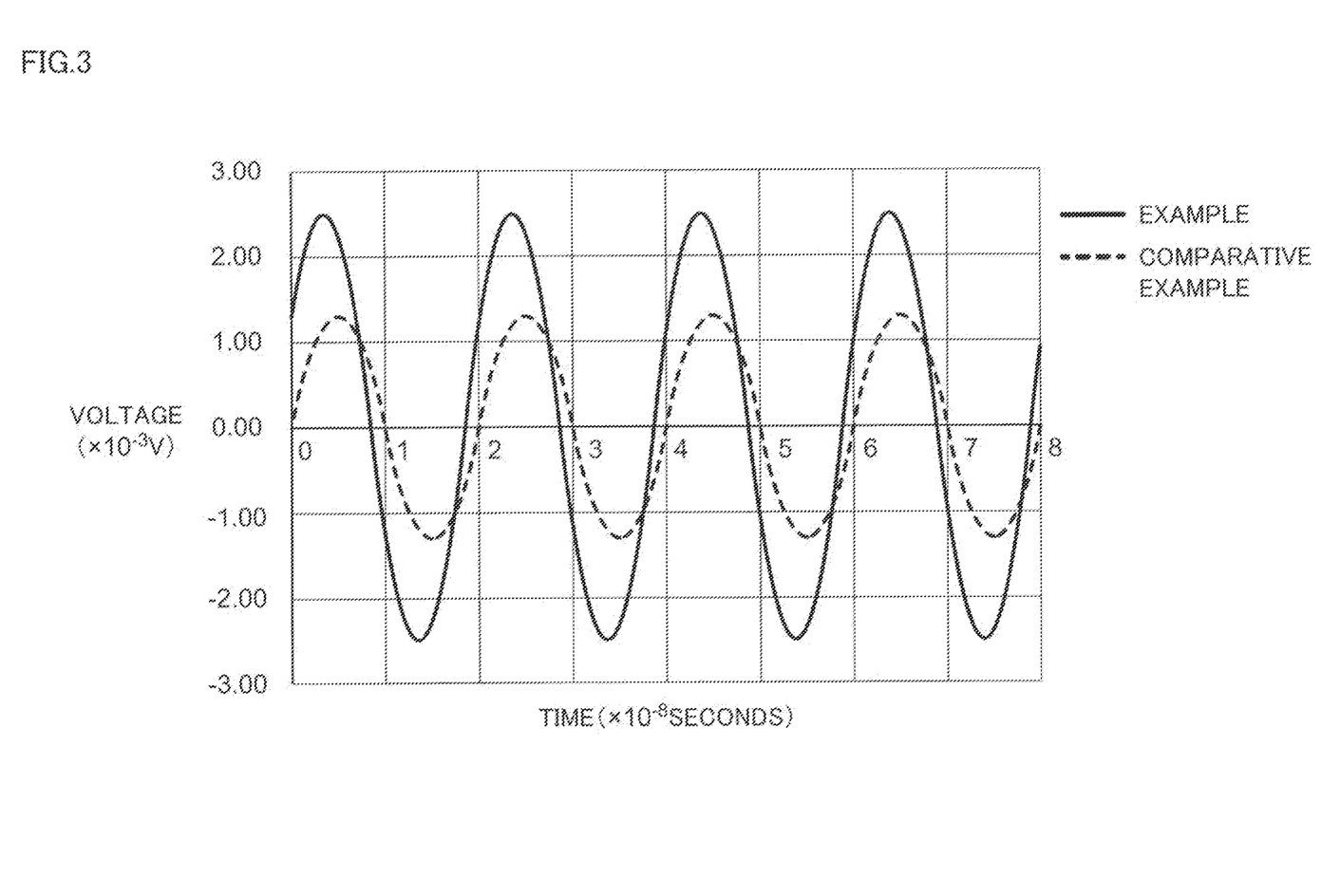
FIG. 3 is a graph showing time variations of output voltages outputted from a magnetic sensor circuit in the exemplary embodiment and the conventional magnetic sensor circuit.

FIG. 3 is a graph showing time variations of the output voltages $V_{out}$ outputted from the magnetic sensor circuit 2 in the exemplary embodiment and the conventional magnetic sensor circuit 2A. Note that FIG. 3 shows the graph obtained by simulation using a computer. In FIG. 3, the output voltage $V_{out}$ of the magnetic sensor circuit 2 in the exemplary embodiment is shown as "Example," and the output voltage $V_{out}$ of the conventional magnetic sensor circuit 2A is shown as "Comparative example." In addition, FIG. 3 shows the time variations of the output voltages $V_{out}$ in the case where the high-frequency voltage with the frequency of 50 MHz and the amplitude of 0.5V is applied to the magnetic sensor circuit 2 and the conventional magnetic sensor circuit 2A by the voltage application part 3.

Here, in the magnetic sensor circuit 2, which is Example, the resistance of the resistor R1 of the first element 11, the resistor R2 of the second element 12, and the resistor R3 of the third element 13 was set to 50Ω, and the inductance of the inductor L2 of the second element 12 was set to 100 nH. Moreover, in the magnetic sensor circuit 2, the capacitance of the capacitor C1 of the first element 11 and the capacitor C3 of the third element 13 was set to 33.8 pF.

Similarly, in the conventional magnetic sensor circuit 2A, which is the conventional example, the resistance of the resistor R1' of the first element 11, the resistor R2' of the second element 12, and the resistor R3' of the third element 13 was set to 50Ω. Moreover, in the conventional magnetic sensor circuit 2A, the capacitance of the capacitor C1' of the first element 11 was set to 40 pF.

In FIG. 3, in the magnetic sensor circuit 2 and the conventional magnetic sensor circuit 2A, it was assumed that the magnetic field sensed by the magnetic sensor 14 was changed from the predetermined reference value (OH), and thereby the resistance of the resistor R4 of the magnetic sensor 14 was increased by 2%, from 50Ω to 51Ω, and the inductance of the inductor L4 was increased by 2%, from 100 nH to 102 nH.

As shown in FIG. 3, in the magnetic sensor circuit 2 of the exemplary embodiment, as compared to the conventional magnetic sensor circuit 2A, the amplitude of the output voltage $V_{out}$, which was outputted in the case where the magnetic field sensed by the magnetic sensor 14 changed from the predetermined reference value, was large.

To additionally describe, it was confirmed that adoption of the magnetic sensor circuit 2 of the exemplary embodiment made it possible to improve the accuracy in detecting the changes in the magnetic field by the magnetic field detection device 1, as compared to the conventional magnetic sensor circuit 2A.

(Capacitor C1 of First Element 11 and Capacitor C3 of Third Element 13)

Incidentally, in the magnetic sensor circuit 2, due to the relation between the inductive reactance of the inductor L2 of the second element 12 and the inductor L4 of the magnetic sensor 14 and the capacitive reactance of the capacitor C1 of the first element 11 and the capacitor C3 of the third element 13, the amplitude, etc., of the output voltage $V_{out}$, which is outputted in the case where the magnetic field sensed by the magnetic sensor 14 was changed from the reference value, change.

To put it another way, in the magnetic sensor circuit 2 of the exemplary embodiment, the capacitance, etc., of the capacitor C1 of the first element 11 and the capacitor C3 of the third element 13 are adjusted for the inductor L2 of the second element 12 and the inductor L4 of the magnetic sensor 14; thereby it is possible to increase the amplitude of the output voltage $V_{out}$.

Figure 4A:
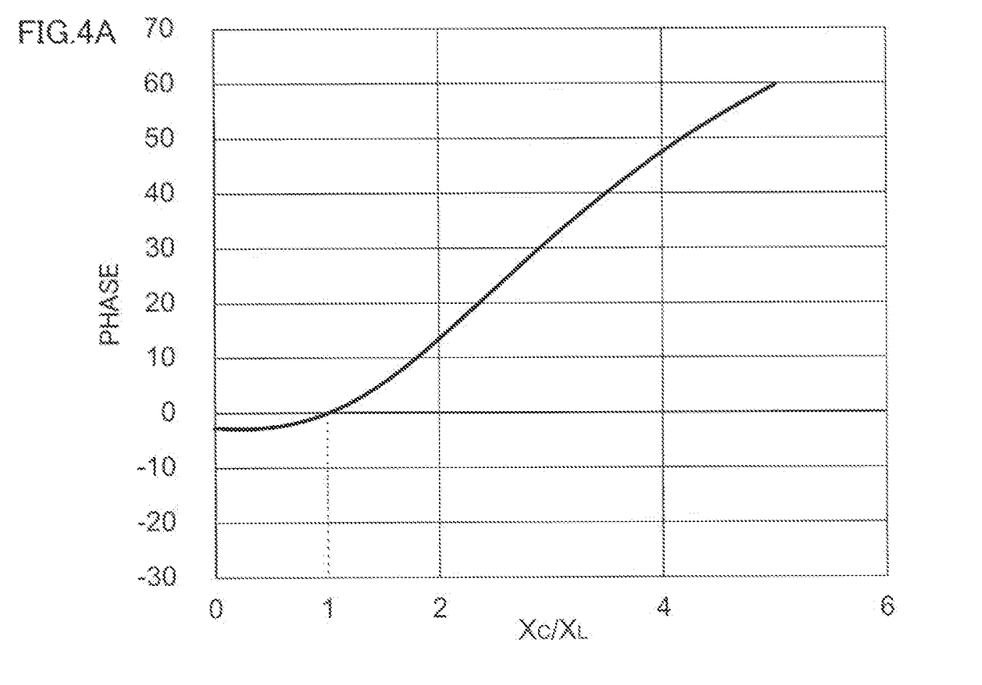
FIGS. 4A and 4B show changes in the phase and amplitude of the output voltage from the magnetic sensor circuit, respectively, when the ratio of the capacitive reactance of the capacitors of the first element and the third element to the inductive reactance of the inductor of the second element is changed.
Figure 4B:
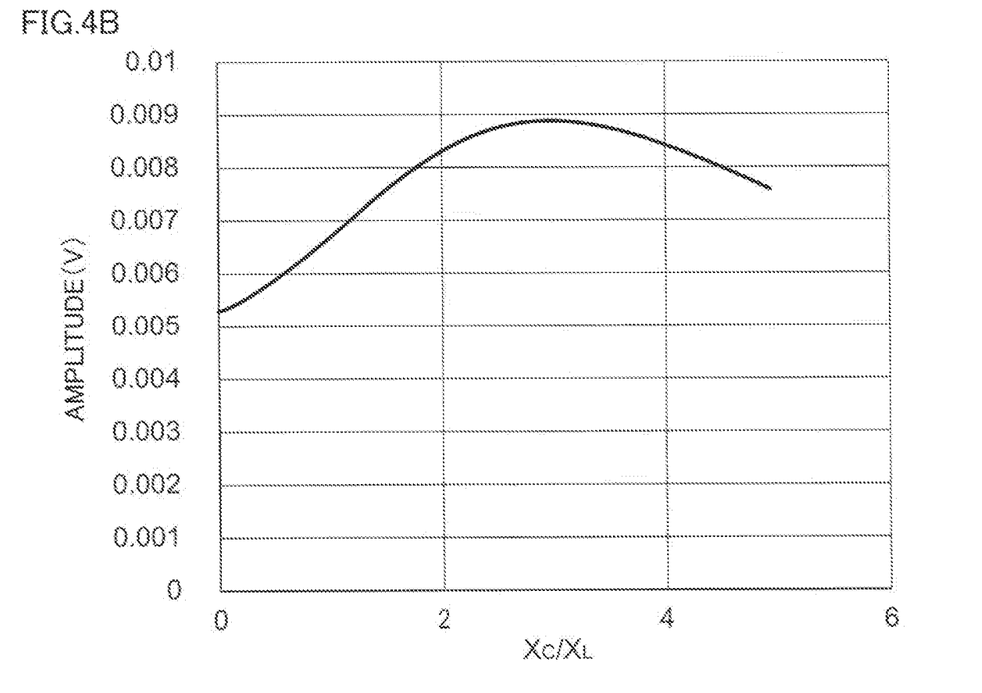

FIGS. 4A and 4B show changes in the phase and amplitude of the output voltage $V_{out}$ from the magnetic sensor circuit 2, respectively, in the case where the ratio ($X_C/X_L$) of the capacitive reactance $X_C$ of the capacitor C1 of the first element 11 and the capacitor C3 of the third element 13 to the inductive reactance $X_L$ of the inductor L2 of the second element 12 is changed within the range from 0 to 5. FIG. 4A shows the changes in the phase of the output voltage $V_{out}$, and FIG. 4B shows the changes in the amplitude of the output voltage $V_{out}$. In addition, FIGS. 4A and 4B show the graphs obtained by simulation using a computer. Further, FIGS. 4A and 4B show the phase and the amplitude of the output voltage $V_{out}$, respectively, in the case where the high-frequency voltage with the frequency of 50 MHz and the amplitude of 0.5V is applied to the magnetic sensor circuit 2 by the voltage application part 3.

Note that, here, the capacitance of the capacitor C1 of the first element 11 and the capacitance of the capacitor C3 of the third element 13 are equal to each other (C1=C3). Consequently, in the following description, in the case of referring to the capacitive reactance $X_C$ of the capacitor C1 of the first element 11 and the capacitor C3 of the third element 13, it is sometimes referred to as the capacitive reactance $X_C$ of the capacitor C1 of the first element 11, with the description of the capacitor C3 of the third element 13 being omitted.

In addition, in the following description, the capacitive reactance $X_C$ of the capacitor C1 of the first element 11 is simply referred to as the capacitive reactance $X_C$ of the first element 11 in some cases. Similarly, in some cases, the inductive reactance $X_L$ of the inductor L2 of the second element 12 is simply referred to as the inductive reactance $X_L$ of the second element 12.

In FIGS. 4A and 4B, in the magnetic sensor circuit 2, the resistance of the resistor R1 of the first element 11, the resistor R2 of the second element 12, and the resistor R3 of the third element 13 was set to 50Ω, and the inductance of the inductor L2 of the second element 12 was set to 100 nH. In addition, in FIGS. 4A and 4B, in the magnetic sensor circuit 2, the inductive reactance $X_L$ of the inductor L2 of the second element 12 was set to 30Ω. Further, in FIGS. 4A and 4B, in the magnetic sensor circuit 2, it was assumed that the magnetic field sensed by the magnetic sensor 14 changed from the predetermined reference value (0H), and thereby the resistance of the resistor R4 of the magnetic sensor 14 was increased by 2%, from 50Ω to 51Ω, and the inductive reactance $X_L$ of the inductor L4 was increased by 2%, from 30Ω to 30.6Ω.

As shown in FIG. 4A, in the magnetic sensor circuit 2, in the case where the ratio of the capacitive reactance $X_C$ of the first element 11 to the inductive reactance $X_L$ of the second element 12 is 1 ($X_C/X_L=1$), the phase shift of the output voltage $V_{out}$ relative to the input voltage $V_{in}$ becomes 0. To additionally describe, in the case where the ratio of the capacitive reactance $X_C$ of the first element 11 to the inductive reactance $X_L$ of the second element 12 is 1 ($X_C/X_L=1$), the magnetic sensor circuit 2 resonates with the input voltage $V_{in}$. Note that, in the following description, the point where the ratio of the capacitive reactance $X_C$ of the first element 11 to the inductive reactance $X_L$ of the second element 12 is 1 ($X_C/X_L=1$) is sometimes referred to as a resonance point.

Then, as shown in FIG. 4B, in the magnetic sensor circuit 2, in the case where the ratio of the capacitive reactance $X_C$ of the first element 11 to the inductive reactance $X_L$ of the second element 12 is larger than 1 ($X_C/X_L>1$), the amplitude of the output voltage $V_{out}$ becomes maximum. More specifically, in the example shown in FIG. 4B, in the magnetic sensor circuit 2, when the ratio ($X_C/X_L$) of the capacitive reactance $X_C$ of the first element 11 to the inductive reactance $X_L$ of the second element 12 is about 3, the amplitude of the output voltage $V_{out}$ becomes maximum.

As described above, in the magnetic sensor circuit 2 of the exemplary embodiment, it is preferable that the ratio ($X_C/X_L$) of the capacitive reactance $X_C$ of the first element 11 to the inductive reactance $X_L$ of the second element 12 is not less than 1. To additionally describe, in the magnetic sensor circuit 2, it is preferable that the capacitive reactance $X_C$ of the first element 11 is equal to or more than the inductive reactance $X_L$ of the second element 12. To describe still additionally, in the magnetic sensor circuit 2, it is preferable that the capacitance of the capacitor C1 of the first element 11 and the capacitor C3 of the third element 13 is selected so that the capacitive reactance $X_C$ of the first element 11 (and the third element 13) and the inductive reactance $X_L$ of the second element 12 satisfy the above-described requirements.

In the exemplary embodiment, satisfaction of the above-described requirements by the capacitive reactance $X_C$ of the first element 11 (and the third element 13) and the inductive reactance $X_L$ of the second element 12 makes it possible to increase the amplitude of the output voltage $V_{out}$ in the magnetic sensor circuit 2, and to improve the accuracy in detecting changes in the magnetic field by the magnetic field detection device 1.

By the way, in the magnetic sensor circuit 2, the ratio ($X_C/X_L$) of the capacitive reactance $X_C$ of the first element 11 to the inductive reactance $X_L$ of the second element 12 allowing the amplitude of the output voltage $V_{out}$ to be maximum changes in accordance with the resistance of the resistors R1 to R4.

Figure 5:
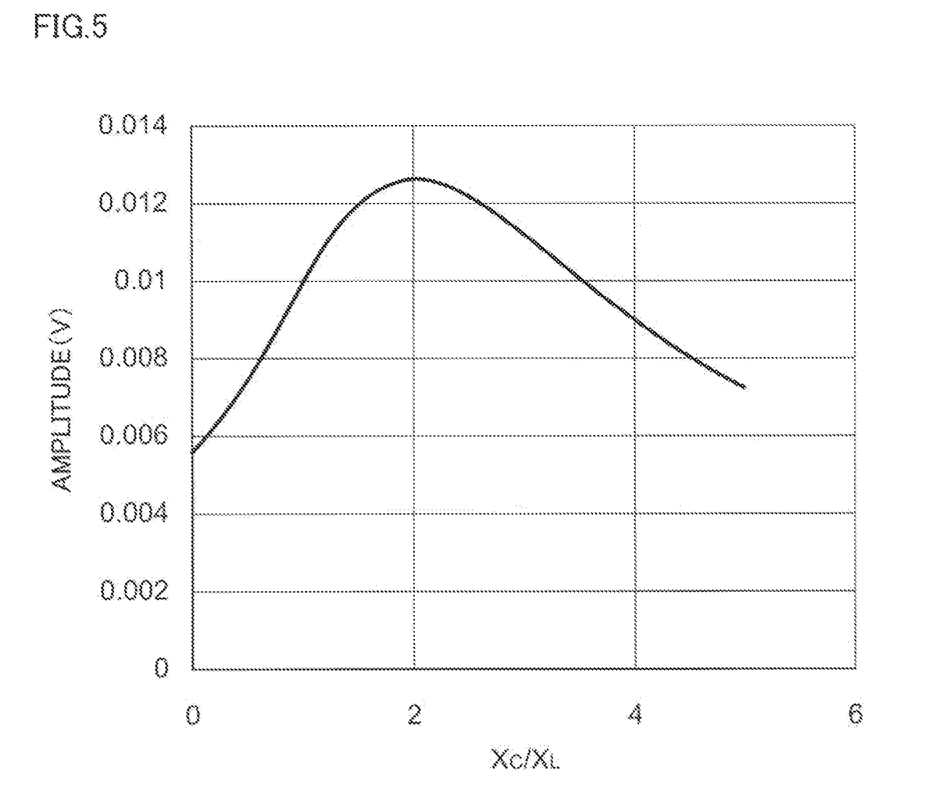
FIG. 5 shows change in the amplitude of the output voltage when the ratio of the capacitive reactance of the first element to the inductive reactance of the second element is changed.
Figure 6:
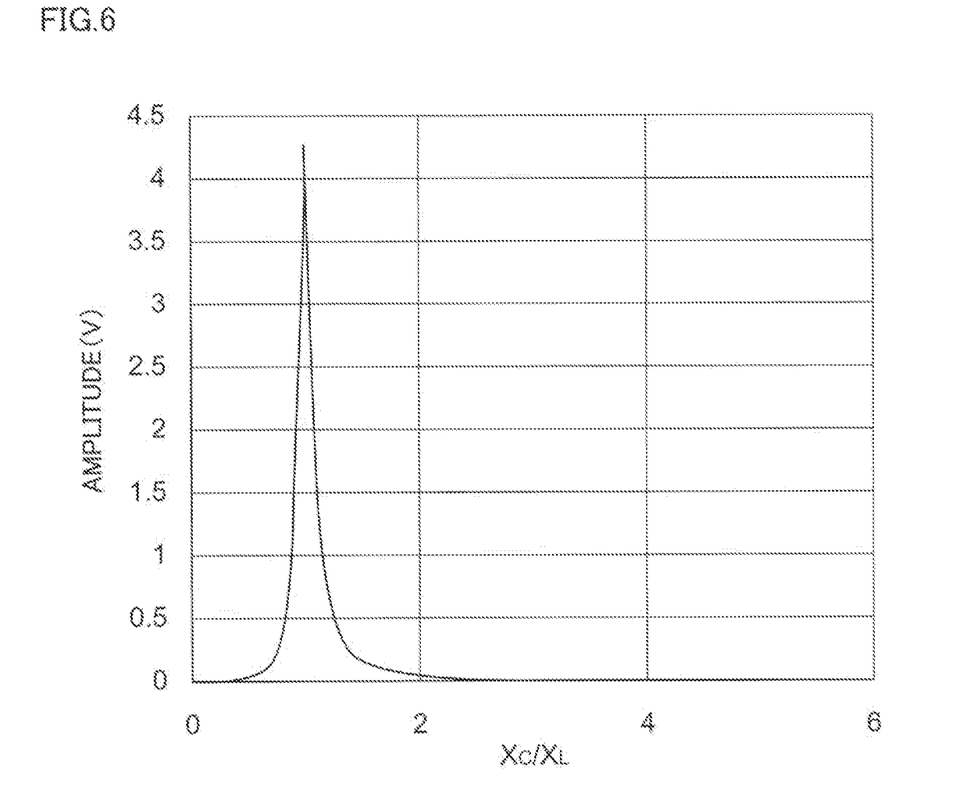
FIG. 6 shows change in the amplitude of the output voltage when the ratio of the capacitive reactance of the first element to the inductive reactance of the second element is changed.

FIGS. 5 and 6 show changes in the amplitude of the output voltage $V_{out}$ in the case where the ratio ($X_C/X_L$) of the capacitive reactance $X_C$ of the first element 11 to the inductive reactance $X_L$ of the second element 12 is changed. In FIGS. 5 and 6, changes in the amplitude of the output voltage $V_{out}$ in the case where the resistance of the resistors R1 to R4 differs from that of the examples in FIGS. 4A and 4B are shown. Note that FIGS. 5 and 6 show the graphs obtained by simulation using a computer.

Specifically, FIG. 5 shows a configuration similar to the magnetic sensor circuit 2 shown in FIGS. 4A and 4B except the points that the resistance of the resistor R1 of the first element 11, the resistor R2 of the second element 12 and the resistor R3 of the third element 13 was changed to 30Ω, and the resistance of the resistor R4 of the magnetic sensor 14 was increased by 2%, from 30Ω to 30.6Ω, and the inductive reactance $X_L$ of the inductor L4 was increased by 2%, from 30Ω to 30.6Ω in the case where the magnetic field sensed by the magnetic sensor 14 was changed from the predetermined reference value (0H).

In addition, FIG. 6 shows a configuration similar to the magnetic sensor circuit 2 shown in FIGS. 4A and 4B except the points that the resistance of the resistor R1 of the first element 11, the resistor R2 of the second element 12 and the resistor R3 of the third element 13 was changed to 1Ω, and the resistance of the resistor R4 of the magnetic sensor 14 was increased by 2%, from 1Ω to 1.02Ω and the inductive reactance $X_L$ of the inductor L4 was increased by 2%, from 30Ω to 30.6Ω in the case where the magnetic field sensed by the magnetic sensor 14 was changed from the predetermined reference value (0H).

Comparison of FIGS. 5 and 6, and the above-described FIG. 4B confirmed that, in the magnetic sensor circuit 2, the ratio ($X_C/X_L$) of the capacitive reactance $X_C$ of the first element 11 to the inductive reactance $X_L$ of the second element 12, which would result in the maximum amplitude of the output voltage $V_{out}$, approached 1 as the resistors R1 to R4 were small.

Consequently, in the magnetic sensor circuit 2, it is preferable to select the capacitance and the like of the capacitor C1 of the first element 11 and the capacitor C3 of the third element 13 in accordance with the resistance of the resistors R1 to R4.

(Configuration of Magnetic Sensor 14)

Subsequently, an example of the configuration of the magnetic sensor 14 in the exemplary embodiment will be described.

Figure 7A:
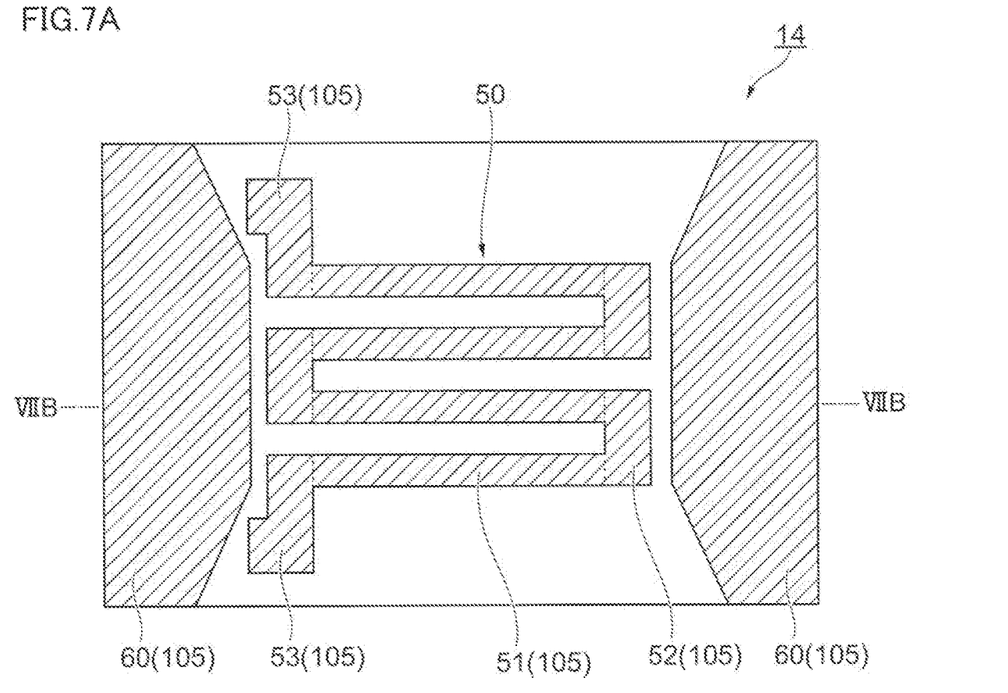
FIGS. 7A and 7B show the configuration of the magnetic sensor to which the exemplary embodiment is applied.
Figure 7B:
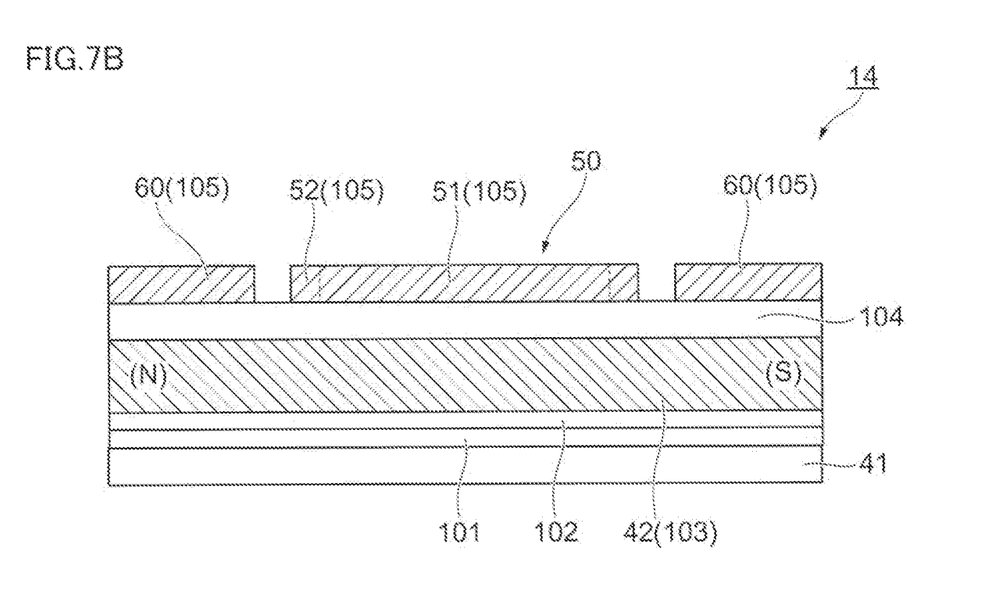

FIGS. 7A and 7B show an example of the configuration of the magnetic sensor 14 to which the exemplary embodiment is applied. FIG. 7A is a plan view and FIG. 7B is a cross-sectional view along the VIIB-VIIB line in FIG. 7A.

As shown in FIG. 7B, the magnetic sensor 14 is configured by laminating an adhesive layer 101, a control layer 102, a thin film magnet 42 composed of a hard magnetic material (a hard magnetic material layer 103), a dielectric layer 104, a sensitive part 50 composed of a soft magnetic material (a soft magnetic material layer 105), and yokes 60 in this order on a nonmagnetic substrate 41.

Here, the hard magnetic material has a large, so-called coercive force, the hard magnetic material being once magnetized by an external magnetic field, even upon removal of the external magnetic field, maintaining the magnetized state. On the other hand, the soft magnetic material has a small, so-called coercive force, the soft magnetic material being easily magnetized by an external magnetic field, but, upon removal of the external magnetic field, quickly returning to a state with no magnetization or a little magnetization.

The adhesive layer 101 is a layer for improving adhesiveness of the control layer 102 to the substrate 41. The control layer 102 controls the magnetic anisotropy of the thin film magnet 42 configured with the hard magnetic material layer 103 to be likely to express in the in-plane direction of the film. The thin film magnet 42 (the hard magnetic material layer 103) applies a bias magnetic field of a predetermined magnitude to a sensitive element 51, which will be described later, of the sensitive part 50 in the longitudinal direction thereof. The dielectric layer 104 is configured with a nonmagnetic dielectric material and electrically insulates the thin film magnet 42 and the sensitive part 50.

As shown in FIG. 7A, the sensitive part 50 includes: plural reed-shaped sensitive elements 51 each having a longitudinal direction and a short direction in a planar shape thereof; connection parts 52 windingly performing serial connection of the adjacent sensitive elements 51; and terminal parts 53 to which electric wires for supplying the electrical current are connected. Here, four sensitive elements 51 are arranged so that the longitudinal directions thereof are in parallel with one another. The sensitive element 51 serves as a magnetic impedance effect element. In the exemplary embodiment, one of the two terminal parts 53 is connected to the above-described second connection point 32, and the other is connected to the above-described fourth connection point 34.

In addition, the yoke 60 guides lines of magnetic force to the end portion in the longitudinal direction of the sensitive element 51.

The sensitive element 51 in the sensitive part 50 is provided with uniaxial magnetic anisotropy in a direction crossing the longitudinal direction, for example, an intersecting short direction (the width direction). As the soft magnetic material (the soft magnetic material layer 105) constituting the sensitive element 51, though not particularly limited, an amorphous alloy, which is an alloy containing Co as a main component doped with a high melting point metal, such as Nb, Ta or W, may be used.

In the magnetic sensor 14, in the case where the high-frequency voltage is applied to the magnetic sensor circuit 2 (refer to FIG. 1) by the voltage application part 3 (refer to FIG. 1), when the magnitude of the magnetic field applied to the sensitive element 51 in the longitudinal direction thereof is changed, the impedance (the above-described impedance Z4) of the sensitive part 50 is changed.

Consequently, in the magnetic sensor circuit 2 and the magnetic field detection device 1 of the exemplary embodiment, as described above, the changes in the magnetic field sensed by the sensitive element 51 of the magnetic sensor 14 can be converted into the amplitude of the output voltage $V_{out}$ outputted from the magnetic sensor circuit 2.

Note that, as long as the magnetic sensor 14 can sense the changes in the magnetic field, and the impedance Z4, the resistance of the resistor R4, and the inductance of the inductor L4 are changed in accordance with the magnitude of the sensed magnetic field as described above, the magnetic sensor 14 is not limited to the above-described configuration.

(Modified Example of Magnetic Sensor Circuit 2)

Figure 8:
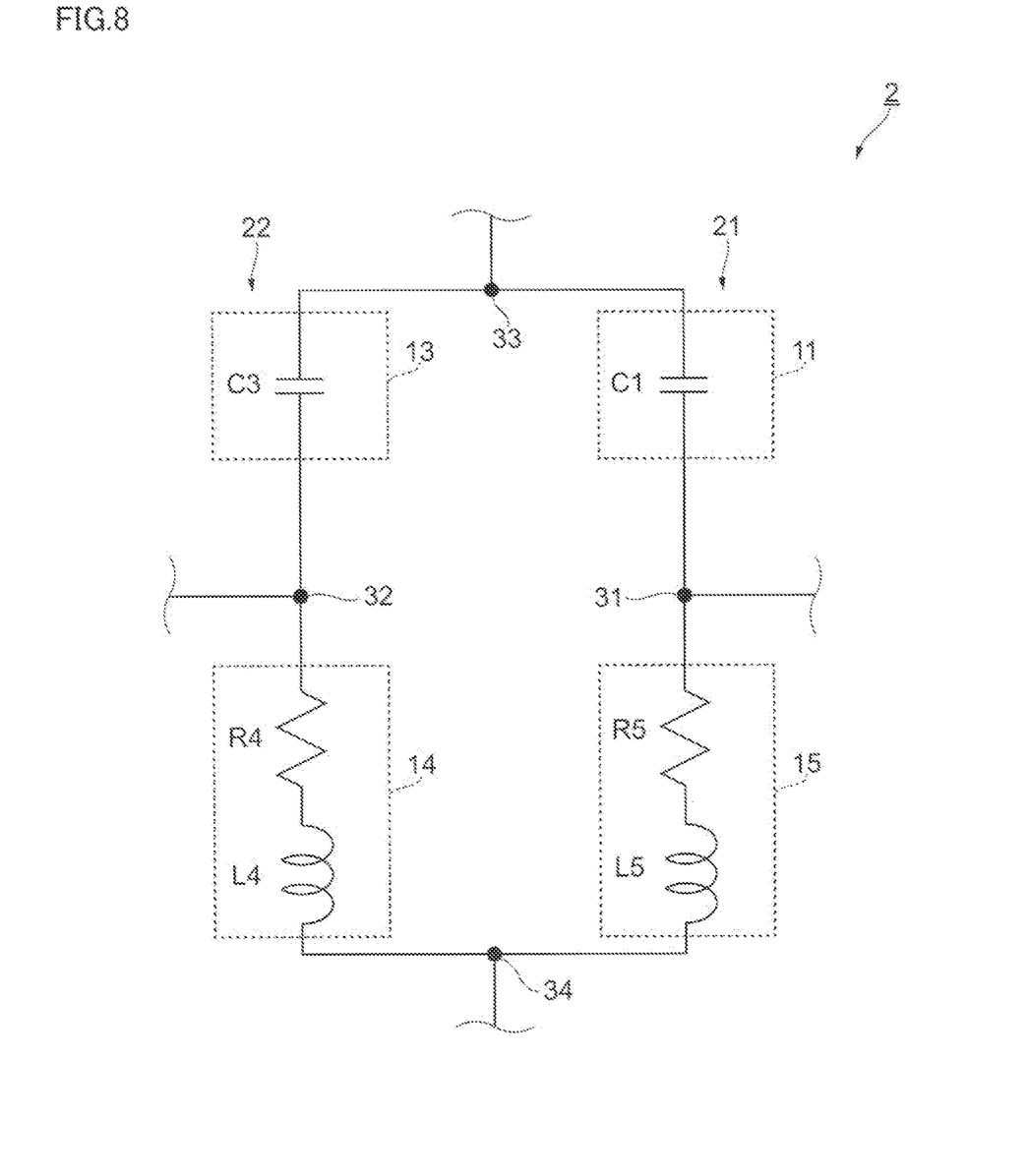
FIG. 8 illustrates a modified example of the magnetic sensor circuit.

Subsequently, a modified example of the magnetic sensor circuit 2 will be described. FIG. 8 illustrates the modified example of the magnetic sensor circuit 2. Note that, in FIG. 8 and the following description, the same reference signs are used for configurations similar to those in the above-described exemplary embodiment, and detailed descriptions thereof will be omitted.

In the magnetic sensor circuit 2 shown in FIG. 8, the first element 11 is configured only with the capacitor C1, and does not include the resistor R1 (refer to FIG. 1). Similarly, in the magnetic sensor circuit 2 shown in FIG. 8, the third element 13 is configured only with the capacitor C3, and does not include the resistor R3 (refer to FIG. 1). Further, the magnetic sensor circuit 2 shown in FIG. 8 is provided with a magnetic sensor 15 sensing the magnetic field by the magnetic impedance effect instead of including the resistor R2 (refer to FIG. 1) and the inductor L2 (refer to FIG. 1) that are connected in series. Note that, similar to the magnetic sensor 14, the magnetic sensor 15 can be treated as an equivalent circuit in which a resistor R5 and an inductor L5 are connected in series. In addition, in the magnetic sensor circuit 2 shown in FIG. 8, the magnetic sensor 15 constitutes the second element.

The magnetic sensor circuit 2 shown in FIG. 8 is also designed so that, in the case where the magnetic field sensed by the magnetic sensor 14 and the magnetic sensor 15 has a predetermined reference value, the impedance Z1 of the first element 11 and the impedance Z3 of the third element 13 are equal (Z1=Z3). Similarly, the magnetic sensor circuit 2 shown in FIG. 8 is designed so that, in the case where the magnetic field sensed by the magnetic sensor 14 and the magnetic sensor 15 has a predetermined reference value, the impedance Z2 of the magnetic sensor 15 (namely, the second element) and the impedance Z4 of the magnetic sensor 14 (namely, the fourth element) are equal (Z2=Z4).

Consequently, in the magnetic sensor circuit 2 shown in FIG. 8, in the case where the magnetic field sensed by the magnetic sensor 14 and the magnetic sensor 15 has a predetermined reference value, the product of the impedance Z1 of the first element 11 and the impedance Z4 of the magnetic sensor 14 and the product of the impedance Z2 of the magnetic sensor 15 and the impedance Z3 of the third element 13 are equal (Z1*Z4=Z2*Z3).

By adoption of such a configuration, in the magnetic sensor circuit 2 shown in FIG. 8, it is possible to increase the amplitude of the output voltage to be outputted in the case where the magnetic field sensed by the magnetic sensor 14 and the magnetic sensor 15 is changed from a predetermined reference value. Consequently, in the magnetic field detection device 1 (refer to FIG. 1) adopting the magnetic sensor circuit 2 shown in FIG. 8, it is possible to improve the accuracy of detection of changes in the magnetic field.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The exemplary embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A magnetic sensor circuit comprising:
    a first element including only a capacitor;
    a second element including a magnetic sensor sensing a magnetic field by a magnetic impedance effect;
    a third element including only a capacitor; and
    a fourth element including a magnetic sensor sensing a magnetic field by a magnetic impedance effect, wherein
    a first series circuit part including the first element and the second element that are connected in series and a second series circuit part including the third element and the fourth element that are connected in series are connected in parallel, and,
    in a case where the magnetic field sensed by the magnetic sensor has a predetermined reference value, a product of impedance Z1 of the first element and impedance Z4 of the fourth element and a product of impedance Z2 of the second element and impedance Z3 of the third element are equal.

2. The magnetic sensor circuit according to claim 1, wherein, in the case where the magnetic field sensed by the magnetic sensor has the predetermined reference value, the impedance Z1 of the first element and the impedance Z3 of the third element are equal, and the impedance Z2 of the second element and the impedance Z4 of the fourth element are equal.

3. The magnetic sensor circuit according to claim 1, wherein a ratio ($X_C/X_L$) of capacitive reactance $X_C$ of the capacitor of the first element to inductive reactance $X_L$ of the inductor of the second element or the magnetic sensor of the second element is not less than 1.

4. The magnetic sensor circuit according to claim 2, wherein a ratio ($X_C/X_L$) of capacitive reactance $X_C$ of the capacitor of the first element to inductive reactance $X_L$ of the inductor of the second element or the magnetic sensor of the second element is not less than 1.

* * * * *